United States Patent
Lai et al.

(10) Patent No.: US 8,913,359 B2
(45) Date of Patent: Dec. 16, 2014

(54) LATCH-UP FREE RC-BASED NMOS ESD POWER CLAMP IN HV USE

(71) Applicants: Da-Wei Lai, Singapore (SG); Ying-Chang Lin, Singapore (SG); Handoko Linewih, Singapore (SG)

(72) Inventors: Da-Wei Lai, Singapore (SG); Ying-Chang Lin, Singapore (SG); Handoko Linewih, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 38 days.

(21) Appl. No.: 13/710,700

(22) Filed: Dec. 11, 2012

(65) Prior Publication Data

US 2014/0160604 A1 Jun. 12, 2014

(51) Int. Cl.
*H02H 3/22* (2006.01)
*H02H 9/04* (2006.01)

(52) U.S. Cl.
CPC .................................. *H02H 9/044* (2013.01)
USPC ............................................. 361/56; 361/111

(58) Field of Classification Search
USPC ...................................................... 361/56, 111
See application file for complete search history.

(56) References Cited

U.S. PATENT DOCUMENTS

| 2004/0160717 A1* | 8/2004 | May et al. | 361/91.5 |
| 2008/0062595 A1* | 3/2008 | Ping et al. | 361/56 |
| 2011/0241731 A1* | 10/2011 | Russ | 326/121 |

* cited by examiner

*Primary Examiner* — Danny Nguyen
(74) *Attorney, Agent, or Firm* — Ditthavong & Steiner, P.C.

(57) ABSTRACT

An RC-based electrostatic discharge protection device provides an extended snapback trigger voltage range, thereby avoiding latch-up. Two parallel current discharge paths are provided between supply terminals during an electrostatic discharge event by virtue of an added external resistor. The first current discharge path includes body resistance of the protection device and the second current discharge path includes the external resistor.

13 Claims, 7 Drawing Sheets

LATCH-UP FREE RC-BASED NMOS ESD POWER CLAMP IN HV USE

TECHNICAL FIELD

This present disclosure relates to electrostatic discharge (ESD) networks, more particularly to power-rail ESD protection circuitry for integrated circuits.

BACKGROUND

A dual-diode based ESD protection network is a common and attractive approach for LCD-driver and power management products in high voltage applications. However, a challenge exists as how to provide an efficient and latch-up free power-rail ESD protection based on a dual-diode based ESD protection network.

A traditional ESD protection circuit in a high voltage process is shown in FIG. 1. Whole chip ESD performance is dependent on the performance of ESD power clamp 12. Avoidance of latch-up is an objective in designing a high voltage application. Latch-up is a term used to describe a short circuit that can occur in an improperly designed circuit, wherein inadvertent creation of a low-impedance path between the power supply rails of a MOSFET circuit occurs. Triggering of a parasitic structure can disrupt proper functioning of the circuit or lead to its destruction by overcurrent.

Various methods traditionally have been implemented for power-rail ESD device protection. Different high voltage power-rail ESD protection arrangements have comparative advantages and disadvantages. For example, ggNMOS (gate-grounded NMOS) circuitry has been used as a power-rail ESD protection device. Such circuitry, however, tends to have latch-up problems due to inherent strong snapback characteristic. Alternatively, the use of gpPMOS as a power-rail ESD protection device can be latch-up free due to non-snapback characteristic, but has a drawback of low efficiency in protecting victims due to low ESD performance.

An attractive and compact size power-rail ESD protection device is RC-based NMOS. However, the RC-based NMOS has inherent drawbacks such as strong snapback behavior that will limit the ESD performance of the RC-based NMOS ESD power clamp circuit once entering the snapback regime. ESD performance of traditional RC-based NMOS ESD power clamps is similar to that of ggNMOS implementations. When a traditional RC-based NMOS power clamp enters snapback regime, the device will suffer permanent damage.

A need thus exists for an RC-based NMOS power-rail ESD protection circuit with high snapback voltage behavior to achieve efficient, ESD robust and compact size ESD power clamp in high voltage process. Such a device should have a low likelihood of latch-up with high snapback voltage characteristic.

SUMMARY

The needs described above are fulfilled, at least in part, by a protection circuit having a resistor and capacitor connected in series across a pair of supply terminals. A gate of an NMOSFET is coupled by a body resistance to one of the supply terminals. An external resistor is connected in series with the NMOSFET across the supply terminals. The gate of the NMOSFET is coupled to a junction between the resistor and capacitor. A plurality of three diodes is connected in series between the gate of the NMOSFET and the junction.

A first of the diodes is connected at its input to the junction and is coupled at its output via a switch to a junction between the NMOSFET and the external resistor. The switch may comprise a latch circuit. An input and an output of a second one of the diodes may be connected, respectively, to first and second control terminals of the latch circuit. The resistance value of the external resistor is set to a value to extend a snapback trigger voltage range of the device.

The RC-based electrostatic discharge protection device disclosed herein provides an extended snapback trigger voltage range, thereby avoiding latch-up. Two parallel current discharge paths are provided between supply terminals during an electrostatic discharge event by virtue of the added external resistor. The first current discharge path includes body resistance of the protection device and the second current discharge path includes the external resistor.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
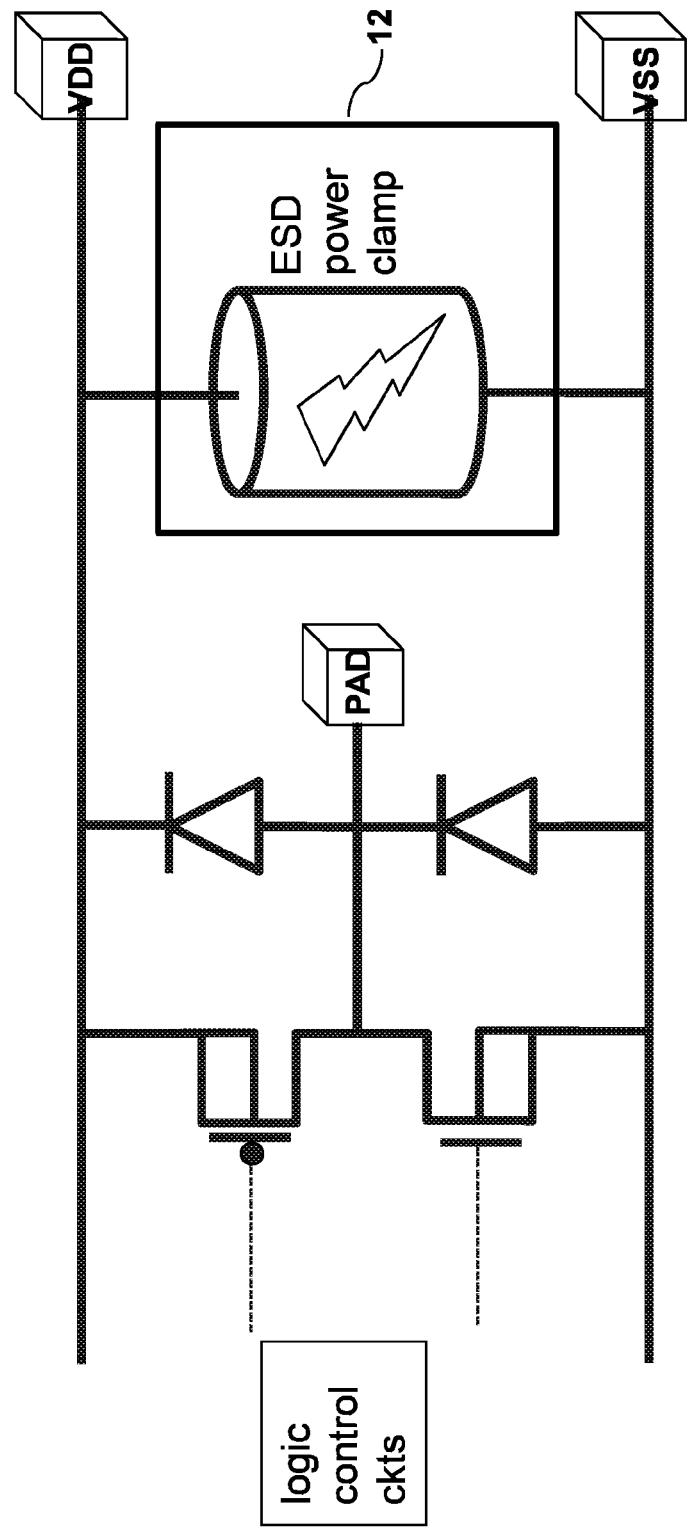
FIG. 1 is a diagram of a traditional PMOS/NMOS power clamp.
Figure 2:
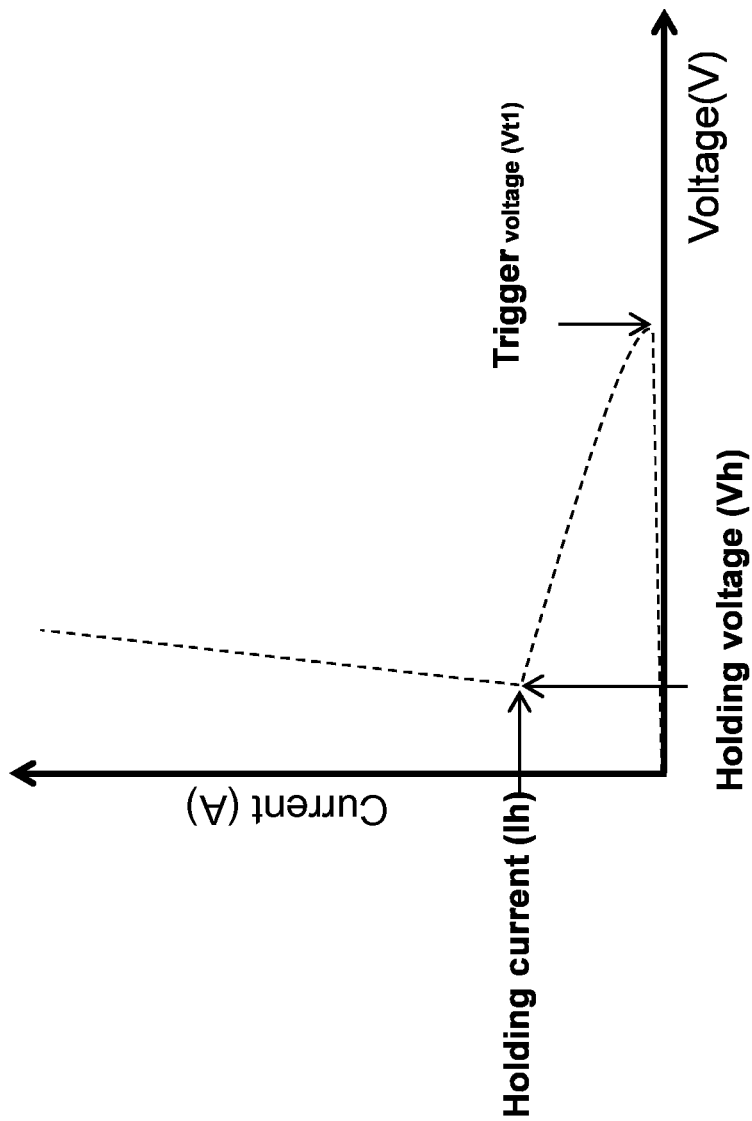
FIG. 2 is a graphic representation of snap-back holding voltage (Vh) and snap-back holding current (Ih) of a snap-back ESD clamp.
Figure 3:
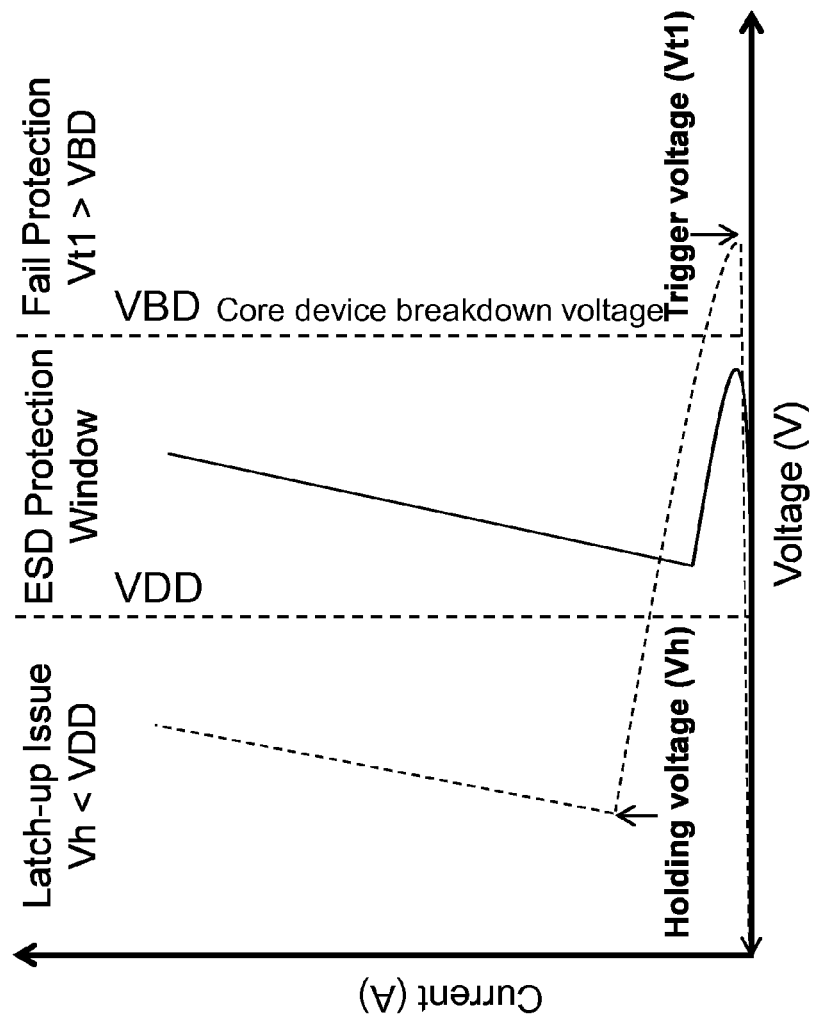
FIG. 3 is a graphic representation of voltage and current levels and the ESD protection windows, i.e., between supply rail voltage (VDD) and the core device breakdown voltage, of a snap-back ESD clamp.

FIG. 2 is a graphic representation of snap-back holding voltage (Vh) and snap-back holding current (Ih) of a snap-back ESD clamp. Once conducting current, the clamp will exhibit "snap-back" or negative resistance characteristics due to its structure. During normal operation, the ESD device represents a high impedance to the circuit up to the ESD device trigger voltage (Vt1). During an ESD event, the trigger voltage will be exceeded and the ESD device will begin to conduct and enter a low impedance state. This point is defined on the curve, shown in FIG. 2, by the snap-back holding voltage (Vh) and snap-back holding current (Ih). To return to a non-conducting state, the current through the device must fall below a snap-back holding current (Ih) and the voltage must fall below a snap-back holding voltage (Vh), For the ESD device to be immune to static and transient latch-up, its snap-back holding voltage must be within an ESD protection window, as illustrated in FIG. 3. The ESD protection window is a voltage range dependent upon the core device breakdown voltage (VBD), i.e., the voltage at which the device trigger voltage (Vt1) causes core failure. Vt1 As can be seen, if the trigger voltage Vt1 exceeds the core breakdown voltage VBD, the snap-back holding voltage Vh falls below the supply rail voltage protection window, causing protection failure. Static latch-up is an event that occurs when the clamp device becomes conductive due to lower snap-back holding voltage of the clamp device or fluctuation of the supply voltage rail (VDD). Transient latch-up is an event that occurs when the clamp device becomes conductive as a result of spikes, noise, or a start-up transient on the supply rail.

Figure 4:
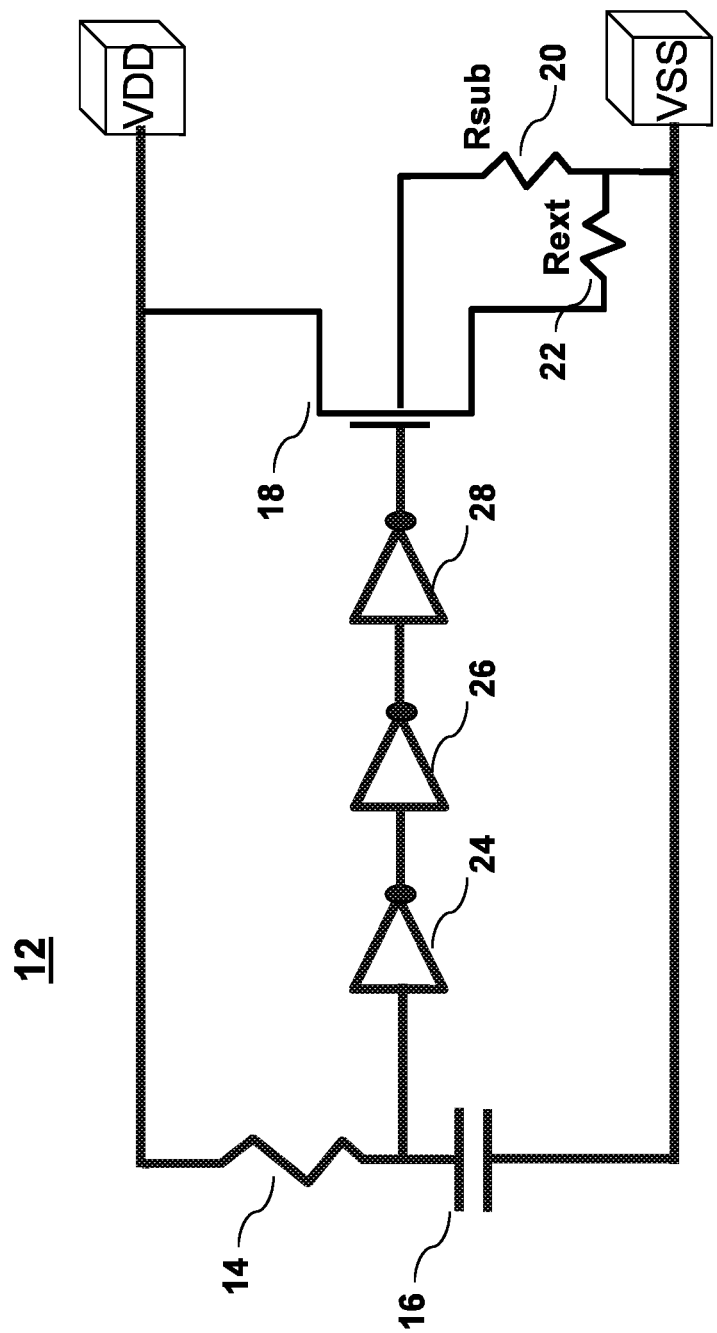
FIG. 4 is an exemplary circuit diagram of an NMOS power clamp embodiment of the present disclosure.

FIG. 4 is a circuit diagram of one embodiment of the ESD clamp of the present disclosure. Connected in series across supply terminals VDD and VSS are capacitor 16 and resistor 14. One terminal of NMOSFET 18 is connected to VDD. The gate of NMOSFET 18 is coupled to VSS via body resistance 20. The other terminal of NMOSFET 18 is connected to VSS via external resistor 20.

Operation of the circuit of FIG. 4 is described with reference to FIG. 5. Under normal operating conditions, i.e., in the absence of an electrostatic event, node N1=VDD, node N2=0v, node N3=VDD, and node N4=0v. As a result, MNESD 18 will not be conducting. During an electrostatic discharge event, node N1=0v, node N2=VDD, node N3=0v, and node N4=VDD. MNESD 18 is thus rendered conductive. ESD current from VDD will bypass the protected circuit through a first path, shown as A channel, and then bypass through the B channel, parasitic bipolar mode, to VSS. With the addition of external resistor 22, the trigger voltage Vt1, or snapback trigger voltage, will increase to twice the value it would otherwise obtain. The snapback action can thus be delayed to improve ESD performance.

Figure 5:
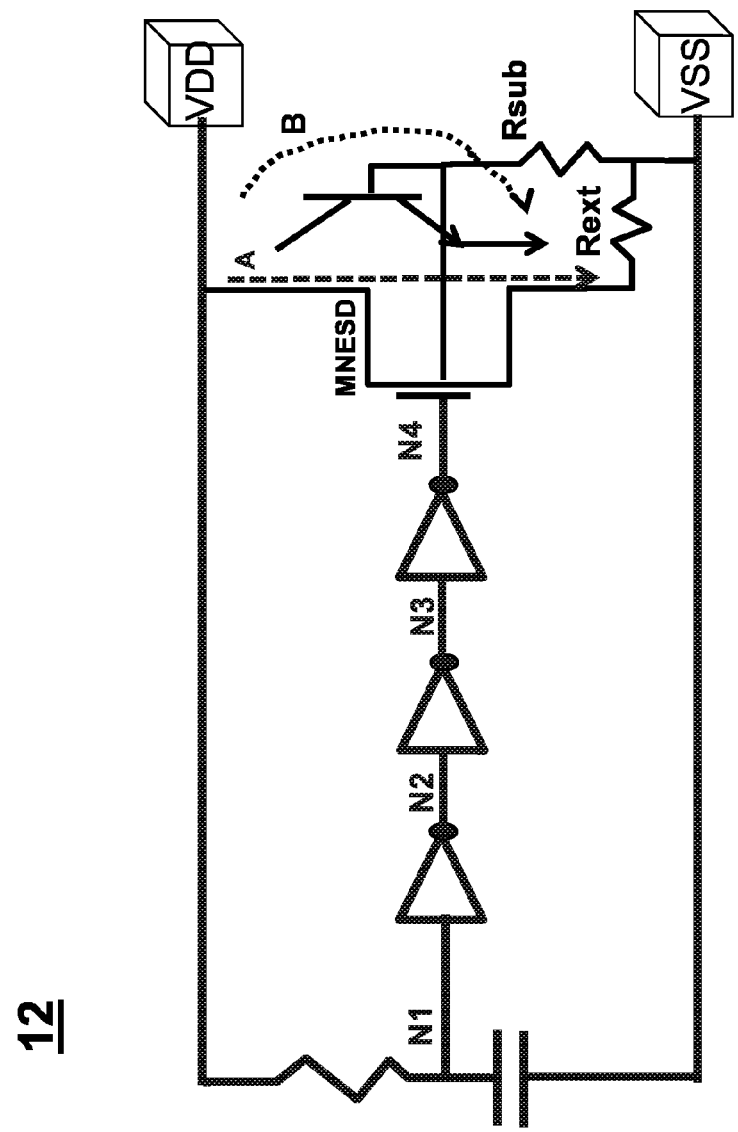
FIG. 5 is a circuit diagram illustrating operation of the NMOS power clamp embodiment of FIG. 4.
Figure 6:
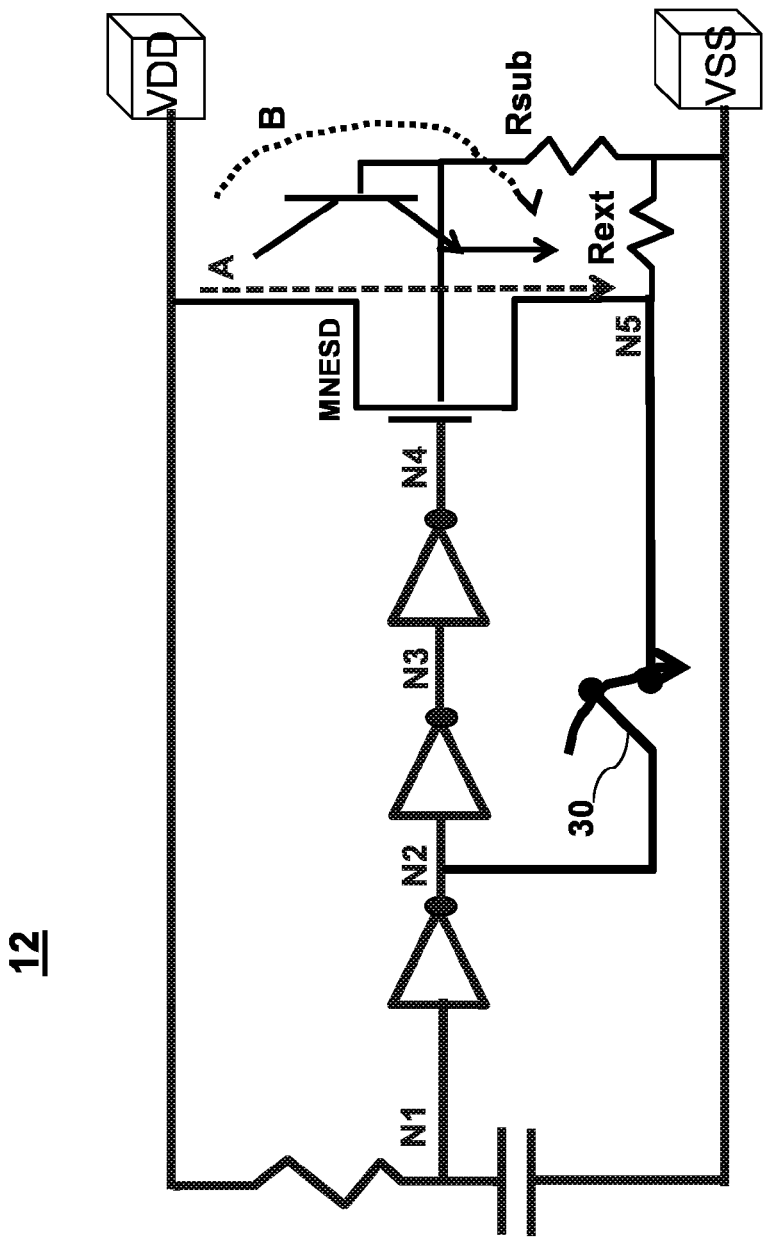
FIG. 6 is a modification of the circuit diagram of the NMOS power clamp shown in FIG. 4.
Figure 7:
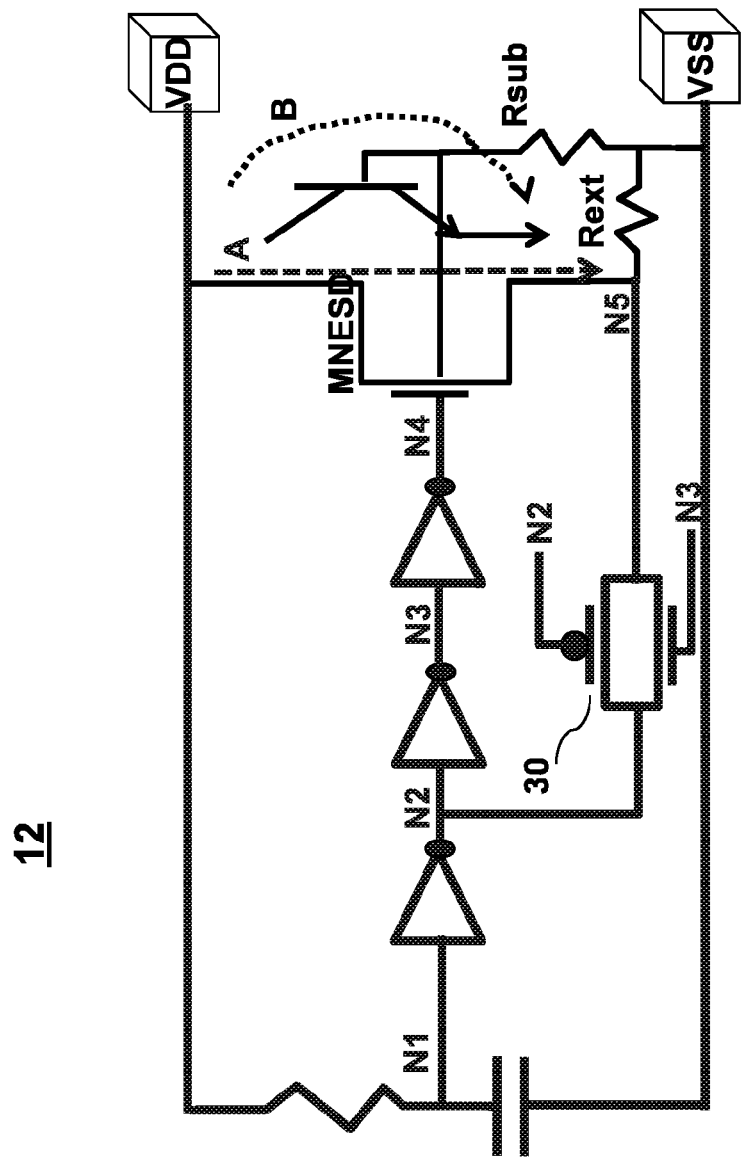
FIG. 7 is a more detailed circuit diagram of the NMOS power clamp of FIG. 6.

FIG. 6 is a modification of the embodiment described with respect to FIGS. 4 and 5. Switch 30 is connected between node N2, the output of diode 24, and node N5, the junction between MNESD 18 and external resistor 22. During normal operation, switch 30 will be closed. During an electrostatic discharge event, switch 30 will be open, and the circuit will operate as described above with respect to FIGS. 4 and 5. Operation of switch 30 can be implemented, for example, as illustrated in FIG. 7. As illustrated, switch 30 may comprise a latch having control inputs connected, respectively, to nodes N2 and N3. Under normal conditions, switch 30 is on. Node N2=0v, N3=VDD, and N5=0v. As there is no voltage difference across resistor 22, there will not be body resistance introduced therefrom. Under an electrostatic discharge event, switch 30 will be off. Node N2=VDD, node N3=0v and node N4=VDD. MNESD 18 is thus rendered conductive. ESD current from VDD will bypass the protected circuit through a first path, shown as A channel, and then bypass through the B channel, parasitic bipolar mode, to VSS. With the addition of external resistor 22, the trigger voltage Vt1, or snapback trigger voltage, will increase to twice the value it would otherwise obtain. The snapback action can thus be delayed to improve ESD performance.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein. For example, other circuits can be used in lieu of the latch shown in FIG. 7 to provide the described switch operation. Further, the concepts disclosed herein are also applicable for use in PMOS circuit arrangements.

The embodiments of the present disclosure can achieve several technical effects, such as an efficient ESD robust, latch-up free, compact sized whole chip ESD protection in high voltage based products such as LCD drivers and power management. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, including, for instance, devices that benefits from reliable ESD protection schemes that utilize less chip area.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a protection circuit for a plurality of voltage supply terminals, the protection circuit comprising:
   a resistor and a capacitor connected in series across a pair of the supply terminals;
   an NMOSFET having a gate coupled by a body resistance to one of the supply terminals;
   an external resistor connected in series with the NMOSFET across the supply terminals; wherein:
   the gate of the NMOSFET is coupled to a junction between the resistor and capacitor;
   a plurality of diodes is connected in series between the gate of the NMOSFET and the junction; and
   a first diode is connected at its input to the junction and its output is coupled to a junction between the NMOSFET and the external resistor.

2. The device according to claim 1, wherein the first diode is connected in series with second and third diodes.

3. The device according to claim 1, further comprising a switch connected between the output of the first diode and the junction between the NMOSFET and the external resistor.

4. The device according to claim 3, wherein the switch comprises a latch circuit.

5. The device according to claim 4, wherein the output of the first diode is connected to an input of a second diode, and wherein the input of the second diode and an output of the second diode is connected respectively, to first and second control terminals of the latch circuit.

6. The device according to claim 5, wherein a third diode is connected between the second diode and the gate of the NMOSFET.

7. The device according to claim 1, wherein the resistance value of the external resistor is set to a value to extend a snapback trigger voltage range of the device.

8. A method for protecting an integrated circuit against electrostatic discharge damage, the method comprising:
- connecting a resistor and capacitor in series across a pair of the supply terminals;
- coupling a gate of a NMOSFET by a body resistance to one of the supply terminals;
- connecting an external resistor in series with the NMOSFET across the supply terminals;
- coupling the gate of the NMOSFET to a junction between the resistor and capacitor;
- connecting a plurality of diodes connected in series between the gate of the NMOSFET and a junction with the capacitor; and
- connecting a switch between the output of one of the diodes and a junction between the NMOSFET and the external resistor.

9. A method as recited in claim 8, wherein the switch comprises a latch circuit.

10. A method as recited in claim 9, wherein the output of the first diode is connected to an input of a second diode, and wherein an input and an output of a second diode is connected respectively, to first and second control terminals of the latch circuit.

11. A method for protecting an integrated circuit against electrostatic discharge damage, the method comprising:
- connecting a resistor and a capacitor in series across a pair of the supply terminals;
- coupling a gate of a NMOSFET by a body resistance to one of the supply terminals;
- connecting an external resistor in series with the NMOSFET across the supply terminals;
- coupling the gate of the NMOSFET to a junction between the resistor and capacitor;
- and setting the resistance value of the external resistor to a value to extend a snapback trigger voltage range.

12. A method for extending snapback behavior of an RC-based electrostatic discharge protection device comprising:
- providing a first current discharge path between supply terminals during an electrostatic discharge event; and
- providing a second current discharge path in parallel with the first discharge path;

wherein:
- a snapback trigger voltage range of the protection device is extended;
- the first current discharge path comprises body resistance of the protection device and the second current discharge path comprises an external resistor; and
- a plurality of diodes are connected in series between the gate of an NMOSFET and a capacitor; and
- a switch is coupled between the output of one of the diodes and a junction between the NMOSFET and the external resistor.

13. A method as recited in claim 12, wherein the switch comprises a latch.

* * * * *